United States Patent
Qian et al.

(10) Patent No.: US 10,892,730 B2
(45) Date of Patent: Jan. 12, 2021

(54) ACOUSTIC FILTER WITH PACKAGING-DEFINED BOUNDARY CONDITIONS AND METHOD FOR PRODUCING THE SAME

(71) Applicant: VANGUARD INTERNATIONAL SEMICONDUCTOR SINGAPORE PTE. LTD., Singapore (SG)

(72) Inventors: You Qian, Singapore (SG); Humberto Campanella-Pineda, Singapore (SG); Rakesh Kumar, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 135 days.

(21) Appl. No.: 15/993,155

(22) Filed: May 30, 2018

(65) Prior Publication Data
US 2019/0372543 A1 Dec. 5, 2019

(51) Int. Cl.
*H03H 9/02* (2006.01)
*H03H 3/02* (2006.01)
*H01L 41/053* (2006.01)
*H03H 9/56* (2006.01)
*H03H 9/13* (2006.01)
(Continued)

(52) U.S. Cl.
CPC ..... *H03H 9/02086* (2013.01); *H01L 41/0477* (2013.01); *H01L 41/0533* (2013.01); *H01L 41/23* (2013.01); *H03H 3/02* (2013.01); *H03H 9/02031* (2013.01); *H03H 9/13* (2013.01); *H03H 9/205* (2013.01); *H03H 9/562* (2013.01); *H03H 9/564* (2013.01); *H01L 41/187* (2013.01);
(Continued)

(58) Field of Classification Search
CPC ............ H03H 3/02; H03H 9/564; H03H 9/13; H03H 9/562; H03H 9/205; H03H 9/02086; H03H 9/02031; H03H 2003/027; H03H 9/173; H03H 9/1007; H03H 2003/021; H01L 41/0533; H01L 41/0477; H01L 41/23; H01L 41/187; H01L 41/1873; H01L 41/193
USPC .................................................. 333/187, 188
See application file for complete search history.

(56) References Cited

U.S. PATENT DOCUMENTS 7,443,270 B2 * 10/2008 Motai ...................... H03H 3/02
310/312
8,125,123 B2   2/2012 Nishihara et al.
(Continued)

OTHER PUBLICATIONS

Office Action for the related Taiwanese Patent Application No. 108114918, dated Oct. 31, 2019, 6 pages.

*Primary Examiner* — Robert J Pascal
*Assistant Examiner* — Jorge L Salazar, Jr.
(74) *Attorney, Agent, or Firm* — Winston Hsu (57) ABSTRACT

A BAW resonator/filter with a monolithic TFE package that defines an acoustic BC and suppresses resonances from the low-Q piezoelectric area of the resonator and resulting devices are provided. Embodiments include a BAW resonator over a dielectric layer, the BAW resonator including a first metal layer, a thin-film piezoelectric layer, and a second metal layer; a first cavity in the dielectric layer under the first metal layer and a second cavity over the first cavity on the second metal layer; and a pair of TFE anchors on the second metal layer, each TFE anchor adjacent to and on an opposite side of the second cavity and extending beyond the first metal layer.

10 Claims, 9 Drawing Sheets

(51) Int. Cl.
  *H03H 9/205* (2006.01)
  *H01L 41/047* (2006.01)
  *H01L 41/23* (2013.01)
  *H01L 41/187* (2006.01)
  *H01L 41/193* (2006.01)

(52) U.S. Cl.
  CPC ........ *H01L 41/1873* (2013.01); *H01L 41/193* (2013.01); *H03H 2003/027* (2013.01)

(56) References Cited

U.S. PATENT DOCUMENTS

| | | |
|---|---|---|
| 8,248,185 B2 | 8/2012 | Choy et al. |
| 8,350,445 B1 | 1/2013 | Shirakawa et al. |
| 2014/0225683 A1 | 8/2014 | Burak et al. |
| 2016/0182011 A1 | 6/2016 | Burak et al. |

\* cited by examiner

ACOUSTIC FILTER WITH PACKAGING-DEFINED BOUNDARY CONDITIONS AND METHOD FOR PRODUCING THE SAME

TECHNICAL FIELD

The present disclosure relates to micro-electronic-mechanical systems (MEMS). The present disclosure is particularly applicable to bulk acoustic wave (BAW) resonators and filters.

BACKGROUND

Low quality piezoelectric material commonly appears at the edges of a bottom electrode pattern of a BAW resonator because the piezoelectric crystals, e.g., aluminum nitride (AlN) crystals, are not vertically aligned above the edges, which creates a low-quality (Q) resonant area. Further, unwanted lateral spurious modes often appear in this area as well. A known solution employs an air bridge over the low-Q region; however, this solution requires an extra mask and requires etching of a sacrificial material. Another known solution employs a slab of conductive or dielectric material on the upper surface of the resonator/filter; however, this solution also requires an extra mask and fine control of the slab's dimensions. Further, both known solutions require separate cap wafer packaging, which is unsuitable to provide required boundary condition (BC) control.

A need therefore exists for methodology enabling formation of a BAW resonator/filter that suppresses resonances in the low-Q piezoelectric area of the resonator without requiring extra masks or separate cap wafer packaging.

SUMMARY

An aspect of the present disclosure is a method of forming a BAW resonator with a monolithic thin-film encapsulation (TFE) package that defines an acoustic BC and suppresses resonances from the low-Q piezoelectric area of the resonator.

Another aspect of the present disclosure is a device including a TFE packaged BAW resonator with a TFE-defined acoustic BC.

A further aspect of the present disclosure is a device including a BAW filter formed of a plurality of operatively coupled BAW resonators.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a resonator over a dielectric layer, the BAW resonator including a first metal layer, a thin-film piezoelectric layer, and a second metal layer; forming a first cavity in the dielectric layer under the first metal layer and a second cavity over the first cavity on the second metal layer; and forming a pair of TFE anchors on the second metal layer, each TFE anchor adjacent to and on an opposite side of the second cavity and extending beyond the first metal layer.

Another aspect of the present disclosure is a device including: a first cavity in a dielectric layer; a BAW resonator over the first cavity and the dielectric layer, the BAW resonator including a first metal layer, a thin-film piezoelectric layer, and a second metal layer; a second cavity over the first cavity on the second metal layer; and a pair of TFE anchors on second metal layer, each TFE anchor adjacent to and on an opposite side of the second cavity and extending beyond the first metal layer.

A further aspect of the present disclosure is a device including: a first cavity in a dielectric layer; a BAW resonator over the first cavity and the dielectric layer, the BAW resonator including a first molybdenum (Mo), tungsten (W), aluminum (Al), platinum (Pt), or gold (Au) layer, a thin-film piezoelectric layer of the BAW resonator of aluminum nitride (AlN), scandium aluminum nitride (ScAlN), zinc oxide (ZnO), lithium niobate ($LiNbO_3$), lithium tantalite ($LiTaO_3$), lead zirconate titanate (PZT), or polyvinylidene fluoride (PVDF), and a second Mo, W, Al, Pt, or Au layer; a second cavity over the first cavity on the second metal layer; a TFE cap layer of AlN, $Al_2O_3$, Al, or a polymer on the second metal layer and over the second cavity; and a TFE seal layer of silicon dioxide ($SiO_2$), silicon nitride (SiN), Al, or a polymer over the TFE cap layer, wherein the TFE cap layer on the second metal layer adjacent to and on opposite sides of the second cavity and extending beyond the first metal layer is an acoustic boundary condition.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of low-Q factor resonant areas created at the edges of a bottom electrode of a BAW resonator and known cap wafer packaging being unsuitable to provide BC control attendant upon forming a BAW resonator/filter. The problems are solved, inter alia, by forming a BAW resonator with a monolithic TFE package that defines an acoustic BC and suppresses resonances from the low-Q piezoelectric area of the BAW resonator.

Methodology in accordance with embodiments of the present disclosure includes providing a BAW resonator over a dielectric layer, the BAW resonator includes a first metal layer, a thin-film piezoelectric layer, and a second metal layer. A first cavity is formed in the dielectric layer under the first metal layer and a second cavity is formed over the first cavity on the second metal layer; and a pair of TFE anchors are formed on the second metal layer, each TFE anchor adjacent to and on an opposite side of the second cavity and extending beyond the first metal layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
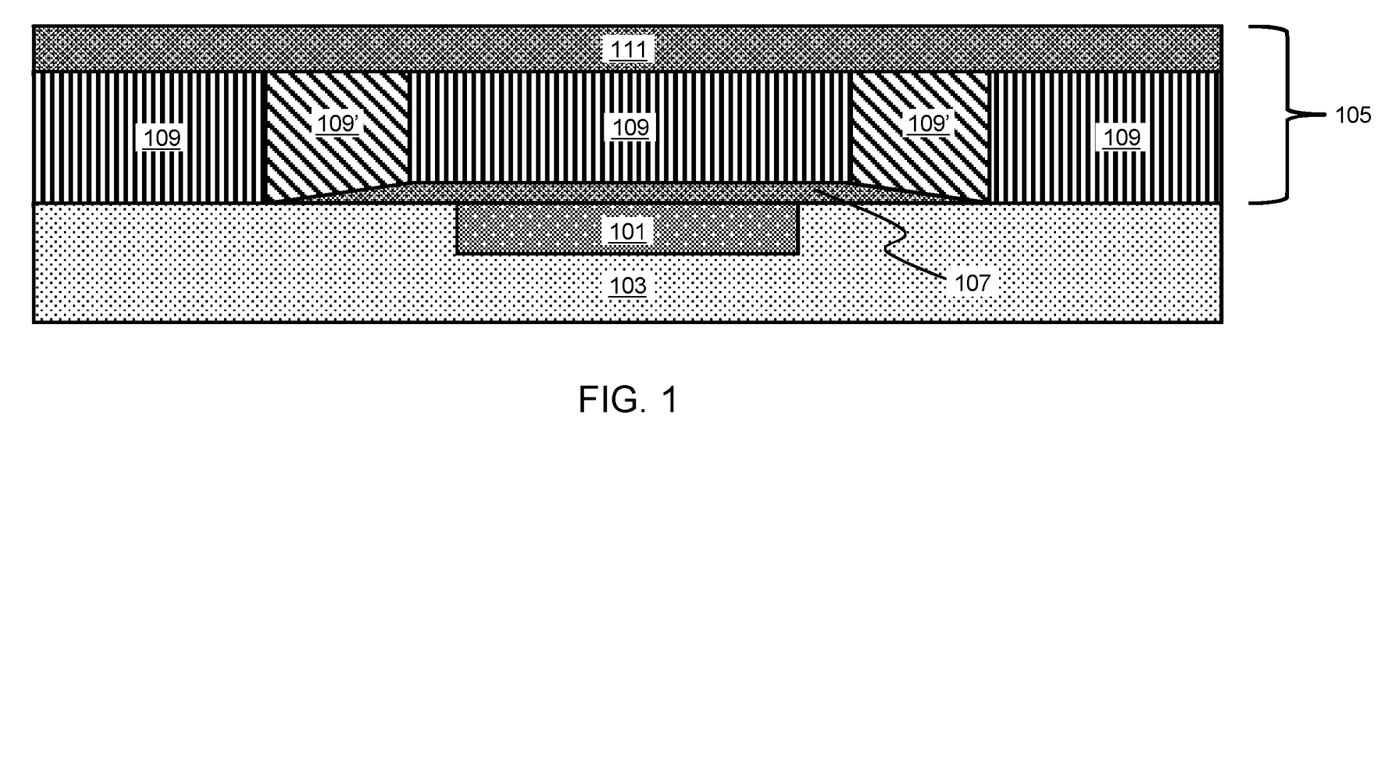
FIGS. 1 through 5 schematically illustrate cross-sectional views of a process flow for forming a TFE-packaged BAW resonator with a TFE cap layer-defined acoustic BC, in accordance with an exemplary embodiment.
Figure 3:
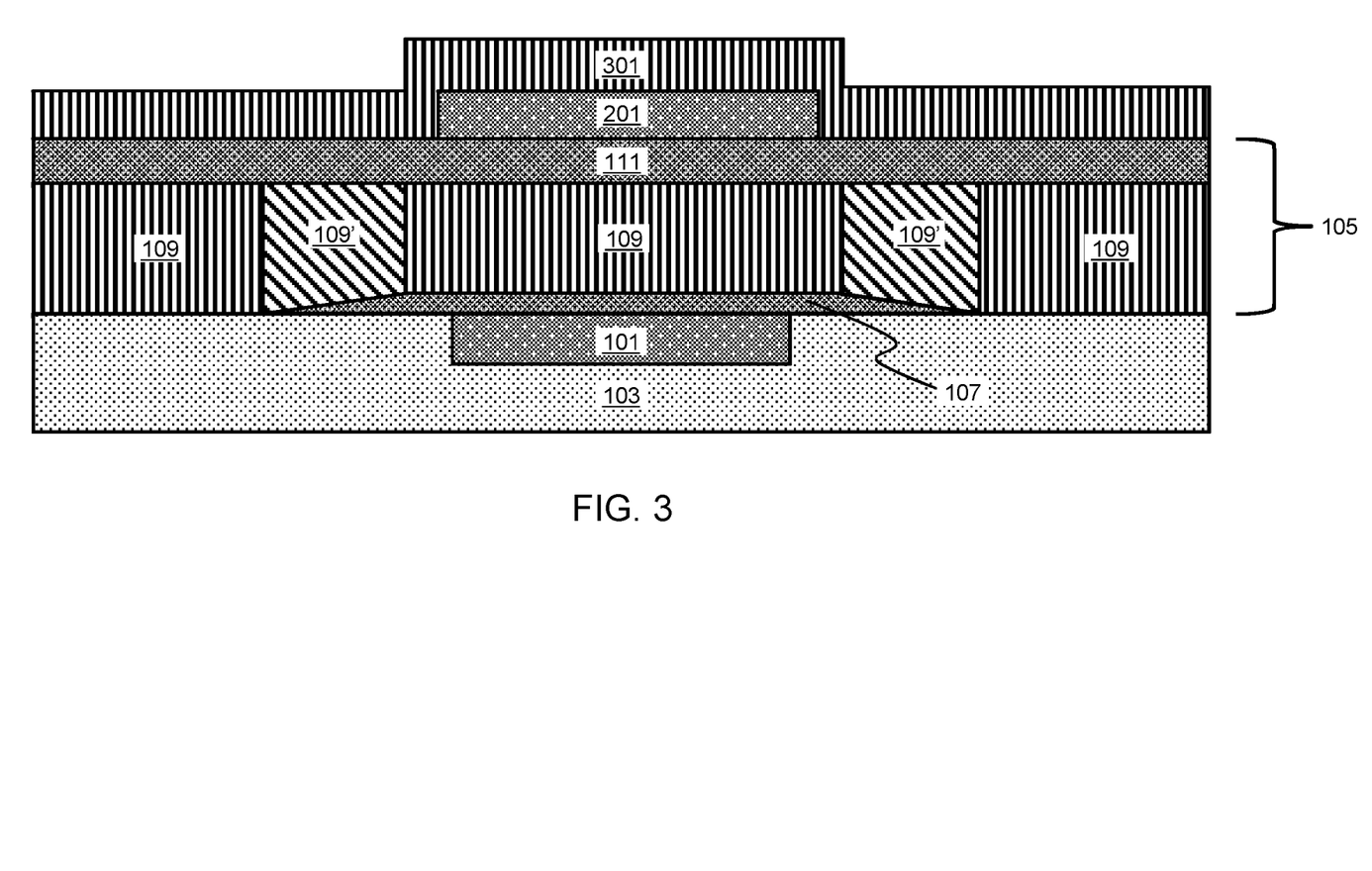
Figure 4:
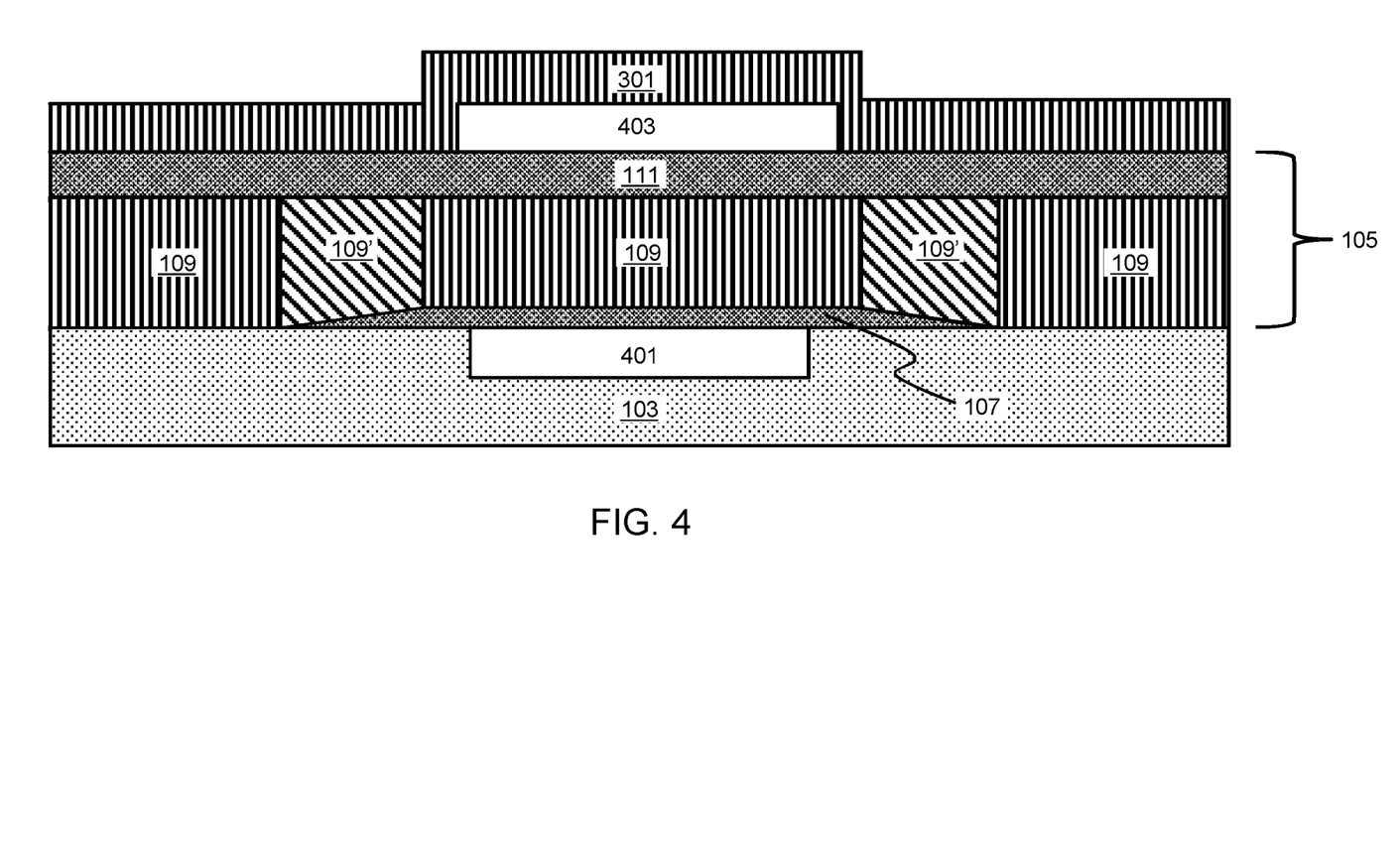
Figure 5:
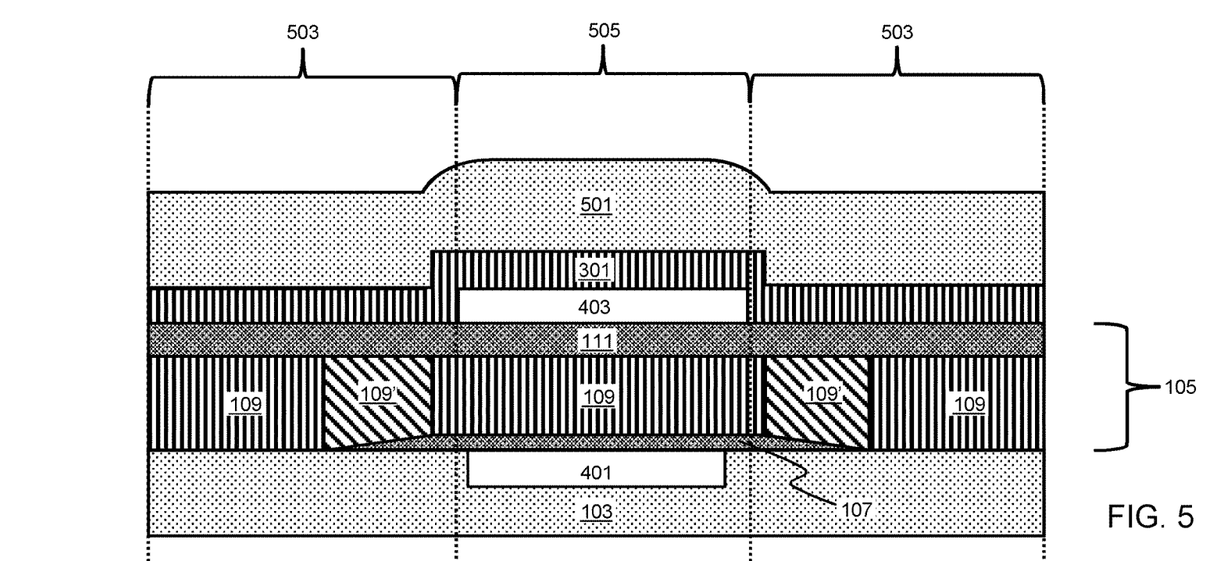
Figure 6:
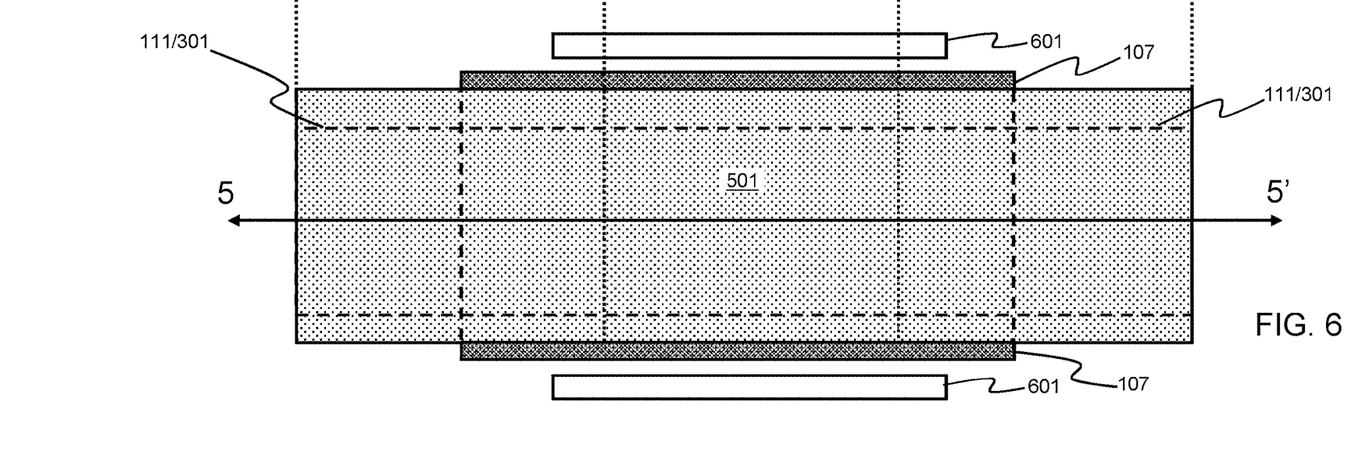
FIG. 6 schematically illustrates a top view of the TFE packaged BAW resonator of FIG. 5.
Figure 7:
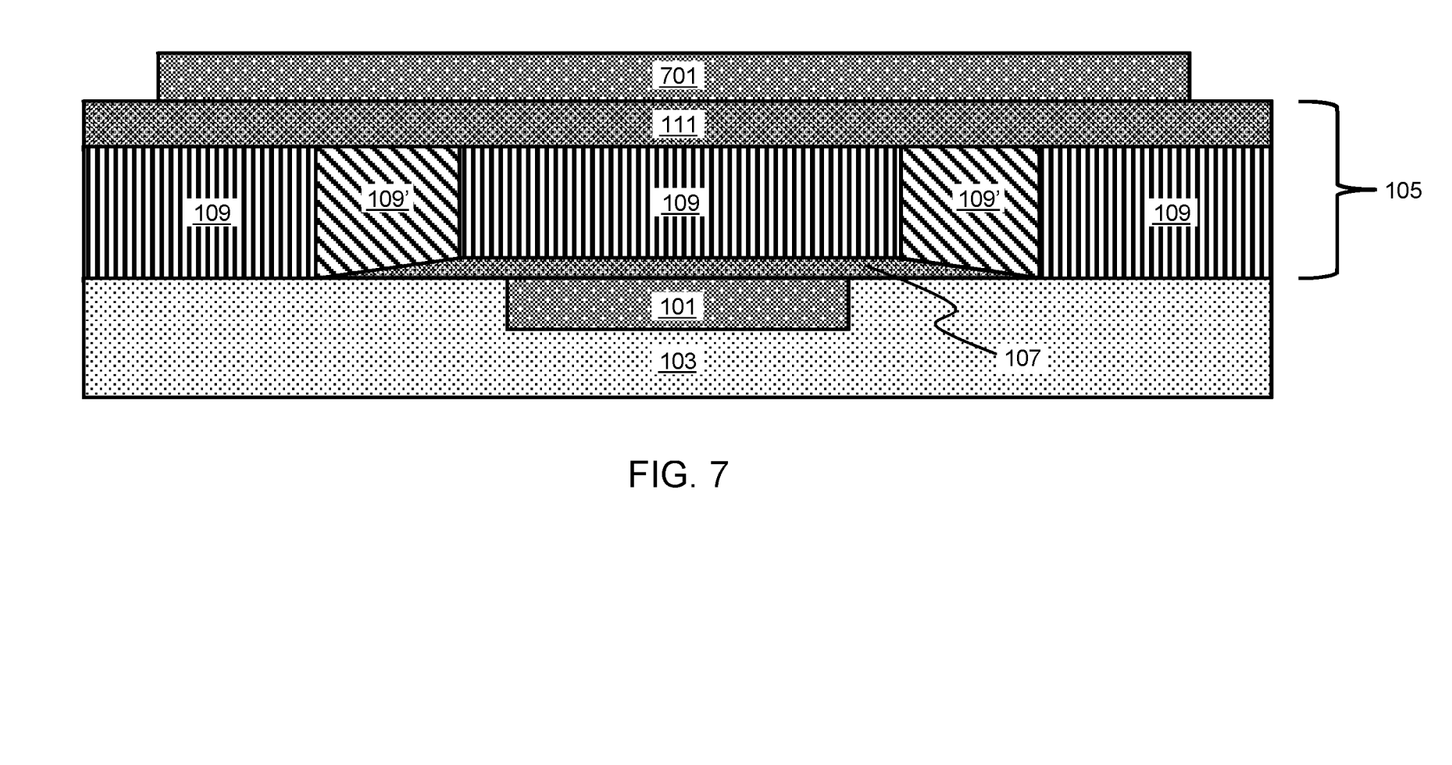
FIGS. 7 through 10 schematically illustrate cross-sectional views of a process flow for forming a TFE-packaged BAW resonator with a TFE seal layer-defined acoustic BC, in accordance with an exemplary embodiment.

FIGS. 1 through 5 schematically illustrate cross-sectional views of a process flow for forming a TFE-packaged BAW resonator with a TFE cap layer-defined acoustic BC and FIG. 6 schematically illustrates a top view of FIG. 5 showing the cut lines for FIG. 5, in accordance with an exemplary embodiment. Referring to FIG. 1, a sacrificial layer 101 is formed, for example, with a width of 1 micrometer (μm) to 1 millimeter (mm) and a thickness of 100 nanometer (nm) to 5 μm, e.g., a width of 100 μm and a thickness of 1 um, in a dielectric layer 103, e.g., formed of Si, SiO$_2$, or SiN, over a semiconductor substrate, e.g., a complimentary metal-oxide-semiconductor (CMOS) wafer (not shown for illustrative convenience). A BAW resonator 105 is then formed over the dielectric layer 103 by forming a metal layer 107 (bottom electrode), e.g., formed of Mo, W, Al, Pt, Au, or a material having similar functional properties, over the sacrificial layer 101 and a portion of the dielectric layer 103; a thin-film piezoelectric layer 109, e.g., formed of AlN, ScAlN, ZnO, LiNbO$_3$, LiTaO$_3$, PZT, PVDF, or a material having similar functional properties, over the dielectric layer 103; and a metal layer 111 (top electrode), e.g., formed of Mo, W, Al, Pt, Au, or a material having similar functional properties, over the thin-film piezoelectric layer 109. As described above, the piezoelectric material of the thin-film piezoelectric layer 109, e.g., AlN, is of poor quality in the regions 109' over the edges of the metal layer 107 as a result of the piezoelectric crystals not being vertically aligned.

Figure 2:
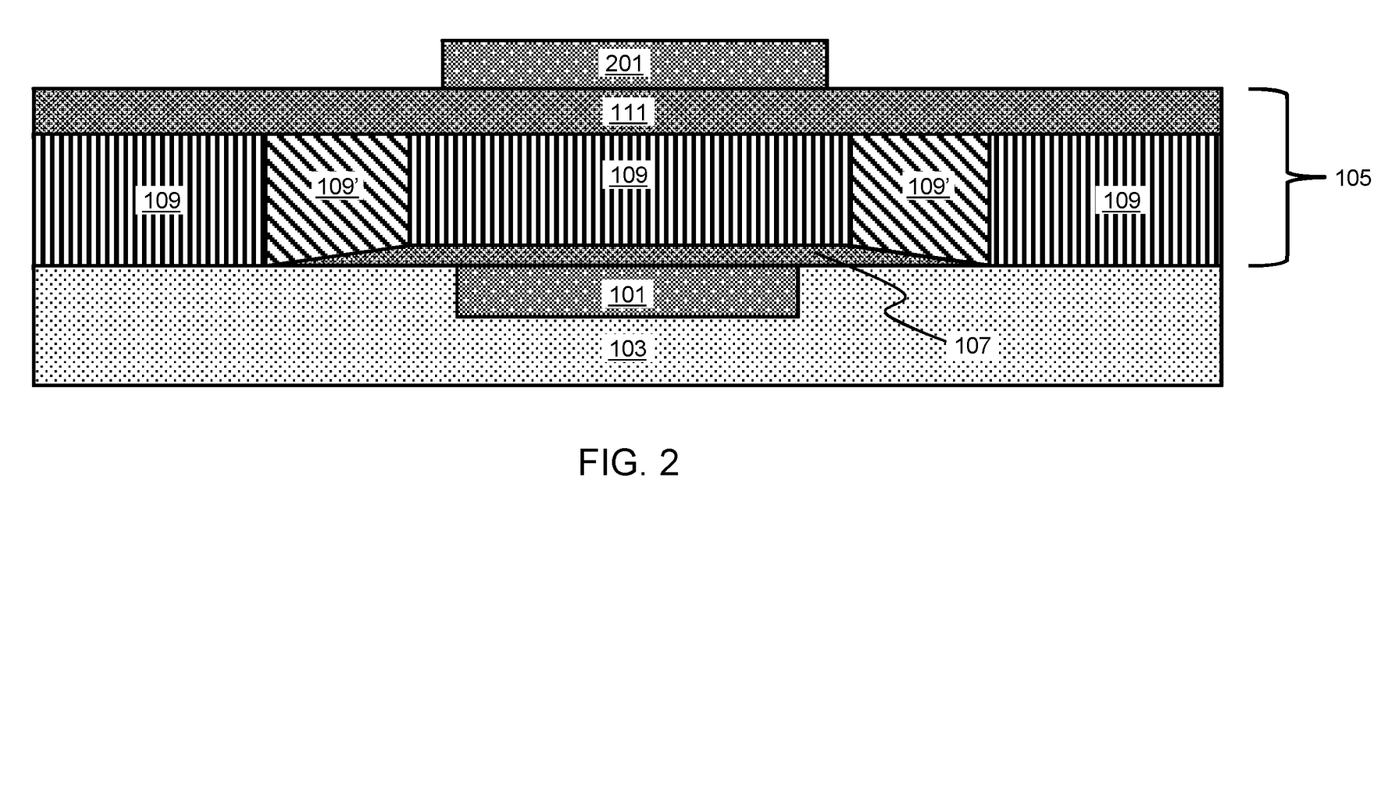

Thereafter, a sacrificial layer 201 is formed, for example, with a width of 1 μm to 1 mm and a thickness of 100 nm to 5 μm, e.g., a width of 100 μm and a thickness of 1 um, on the metal layer 111 above the sacrificial layer 101, as depicted in FIG. 2. Referring to FIG. 3, a TFE cap layer 301 is formed, e.g., of AlN, Al$_2$O$_3$, Al, or a polymer, over the metal layer 111. The TFE cap layer 301 may be formed, e.g., with a thickness of 100 nm to 5 μm.

Referring to FIG. 4, a pair of release vias (not shown for illustrative convenience)(release vias 601 of FIG. 6) are each formed on an opposite side of the BAW resonator 105, and both sacrificial layers 101 and 201 are removed, e.g., by etching, through the release vias, forming the cavities 401 and 403, respectively. A TFE seal layer 501 is then formed, e.g., of SiO$_2$, SiN, Al, or a polymer such as polyimide (PI) or poly(methyl methacrylate)(PMMA), over the dielectric layer 103, as depicted in FIG. 5. The TFE seal layer 501 may have a thickness, e.g., of 4 μm. Consequently, the regions 503 of the TFE cap layer 301 (TFE anchors 503), which are adjacent to and on opposite sides of the cavity 403 and the effective resonator 505, touch the metal layer 111 (top electrode of the BAW resonator 105) and fully cover the low-Q piezoelectric material areas 109' below, thus defining an acoustic BC that suppresses resonances of that area. The TFE anchors 503 may each have a width, e.g., of 2 μm to 50 μm. Further, in one instance, a plurality of BAW resonators 105 (not shown for illustrative convenience) may be formed as described with respect to FIGS. 1 through 5 and the metal layer 107 or 111 may be used to operatively couple one or more BAW resonators 105 of the plurality to form a BAW filter (not shown for illustrative convenience), e.g., some BAW resonators 105 of the plurality may be coupled using the metal layer 107 and some other BAW resonators 105 of the same plurality may be coupled using the metal layer 111.

Figure 8:
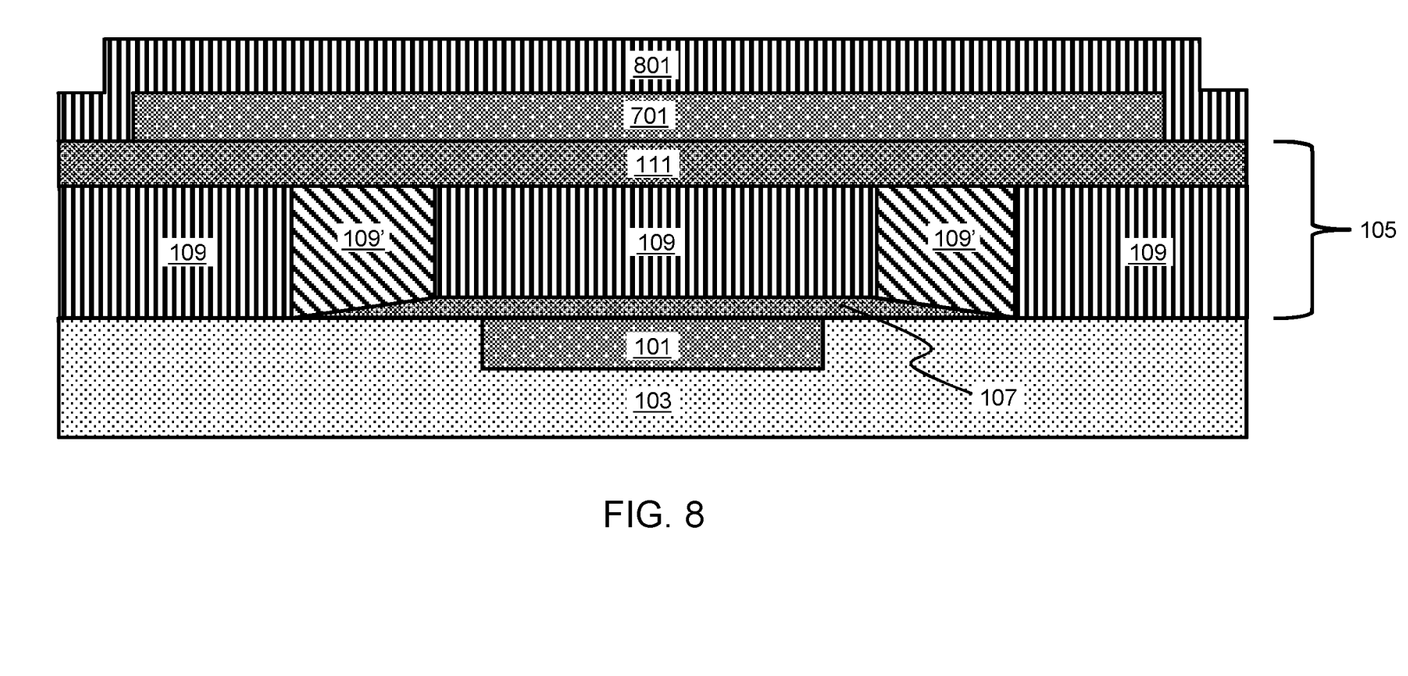

FIGS. 7 through 10 schematically illustrate cross-sectional views of a process flow for forming a TFE-packaged BAW resonator with a TFE seal layer-defined acoustic boundary condition, in accordance with an exemplary embodiment. The structure of FIG. 7 follows from the structure of FIG. 1 and is nearly identical to the structure of FIG. 2, except that in this instance, the upper sacrificial layer 701 (201) extends beyond the metal layer 107 instead of being formed within the lateral boundaries of the metal layer 107, as depicted in FIG. 2. A TFE cap layer 801, similar to the TFE cap layer 301, is then formed over the metal layer 111, as depicted in FIG. 8.

Figure 9:
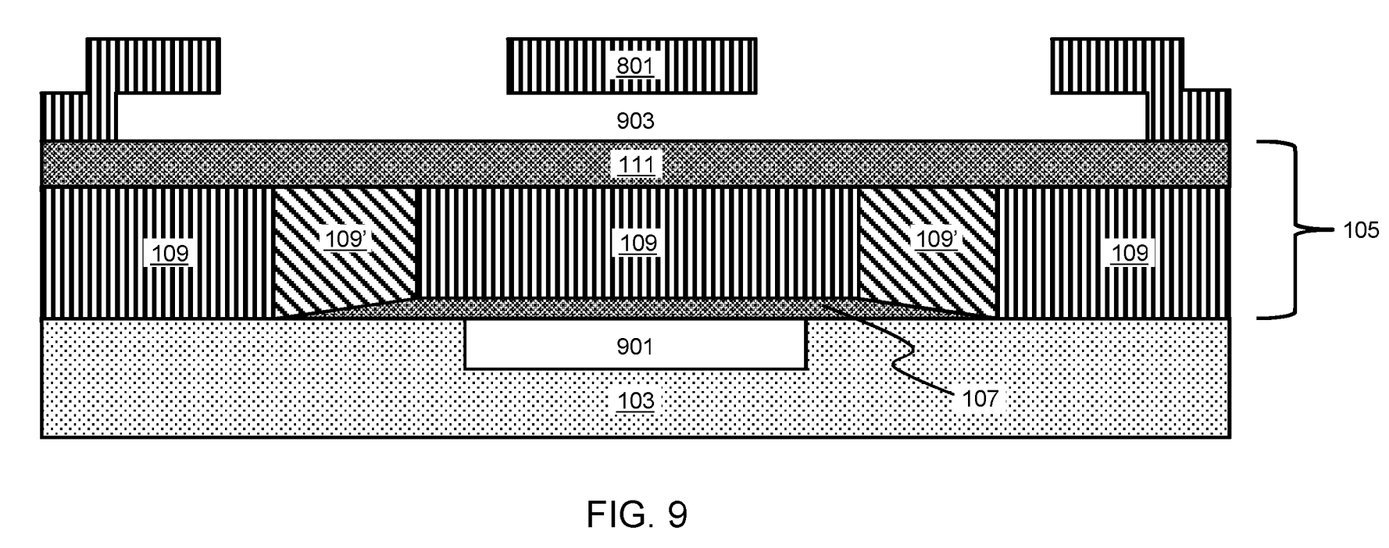
Figure 10:
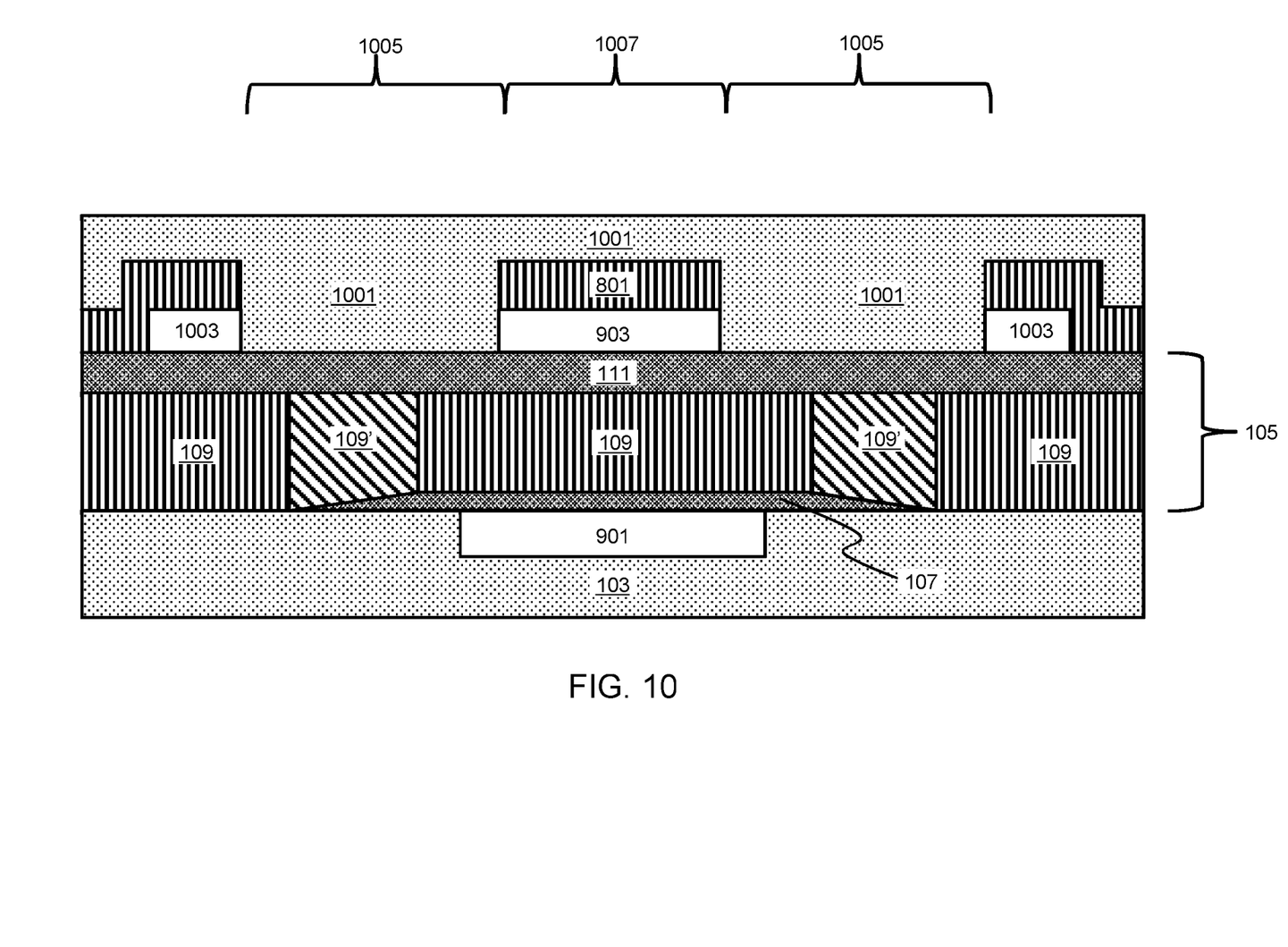

Referring to FIG. 9, instead of forming the release vias 601 as described with respect to FIGS. 5 and 6, in this instance, portions of the TFE cap layer 801 over and extending beyond the low-Q piezoelectric material areas 109' are removed and both sacrificial layers 101 and 701 are released, e.g., by etching, forming the cavities 901 and 903, respectively. A TFE seal 1001, similar to the TFE seal 501 of FIG. 5, is then formed over the dielectric layer 103, forming additional cavities 1003, as depicted in FIG. 10. Consequently, the regions 1005 of the TFE seal layer 1001 (TFE anchors 1005), which are adjacent to and on opposite sides of the cavity 903 and the effective resonator 1007, touch the metal layer 111 (top electrode of the BAW resonator 105) and fully cover the low-Q piezoelectric material areas 901' below, thus defining an acoustic BC that suppresses resonances of that area. Further, in one instance, a plurality of BAW resonators 105 (not shown for illustrative convenience) may be formed as described with respect to FIGS. 7 through 10 and the metal layer 107 or 111 may be used to operatively couple the BAW resonators 105 of the plurality to form a BAW filter (not shown for illustrative convenience), e.g., some BAW resonators 105 of the plurality may be coupled using the metal layer 107 and some other BAW resonators 105 of the same plurality may be coupled using the metal layer 111.

The embodiments of the present disclosure can achieve several technical effects such as a BAW filter/resonator with an improved Q factor and filter performance relative to known similar devices by creating an acoustic BC using the topographic edges of the TFE cap layer, TFE seal layer, or both to suppress resonance in the low-Q piezoelectric area of the BAW resonator without requiring any additional masks or separate cap wafer packaging. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of devices including a BAW resonator or filter.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a first cavity in a dielectric layer;
   a bulk acoustic wave (BAW) resonator over the first cavity and the dielectric layer, the BAW resonator comprising a first metal layer, a thin-film piezoelectric layer, and a second metal layer;
   a second cavity over the first cavity on the second metal layer;
   a pair of thin-film encapsulation (TFE) anchors on the second metal layer, each TFE anchor adjacent to and on an opposite side of the second cavity and extending beyond the first metal layer;
   a TFE cap layer on the second metal layer and over the second cavity; and
   a TFE seal layer over the TFE cap layer, wherein the pair of TFE anchors comprises the TFE cap layer on the second metal layer.

2. The device according to claim 1, wherein the first metal layer and the second metal layer comprise molybdenum (Mo), tungsten (W), aluminum (Al), platinum (Pt), or gold (Au).

3. The device according to claim 1, wherein the thin-film piezoelectric layer comprises aluminum nitride (AlN), scandium aluminum nitride (SLAIN), zinc oxide (ZnO), lithium niobate (LiNbO$_3$), lithium tantalite (LiTaO$_3$), lead zirconate titanate (PZT), or polyvinylidene fluoride (PVDF).

4. The device according to claim 1, wherein the TFE cap layer comprises AlN, Al$_2$O$_3$, Al, or a polymer.

5. The device to claim 1, further comprising:
   the TFE cap layer over pair of third cavities, each third cavity adjacent to a TFE anchor and remote from the second cavity; and
   the TFE seal layer over the TFE cap layer and on the second metal layer between and adjacent to the second cavity and the third cavities,
   wherein the pair of TFE anchors comprises the TFE seal layer on the second metal layer.

6. The device according to claim 5, wherein the TFE seal layer comprises silicon dioxide (SiO$_2$), silicon nitride (SiN), Al, or a polymer.

7. The device to claim 1, wherein the pair of TFE anchors define an acoustic boundary condition.

8. The device according to claim 1, further comprising a plurality of the BAW resonators,
   wherein the first metal layer or the second metal layer operatively couples one or more BAW resonators of the plurality of the BAW resonators to form a BAW filter.

9. A device comprising:
   a first cavity in a dielectric layer;
   a bulk acoustic wave (BAW) resonator over the first cavity and the dielectric layer, the BAW resonator comprising a first molybdenum (Mo), tungsten (W), aluminum (Al), platinum (Pt), or gold (Au) layer, a thin-film piezoelectric layer of the BAW resonator of aluminum nitride (AlN), scandium aluminum nitride (SLAIN), zinc oxide (ZnO), lithium niobate (LiNbO$_3$), lithium tantalite (LiTaO$_3$), lead zirconate titanate (PZT), or polyvinylidene fluoride (PVDF), and a second Mo, W, Al, Pt, or Au layer;
   a second cavity over the first cavity on the second metal layer;
   a thin-film encapsulation (TFE) cap layer of AlN, Al$_2$O$_3$, Al, or a polymer on the second metal layer and over the second cavity; and
   a TFE seal layer of silicon dioxide (SiO$_2$), silicon nitride (SiN), Al, or a polymer over the TFE cap layer,
   wherein the TFE cap layer on the second metal layer is an acoustic boundary condition.

10. The device according to claim 9, further comprising a plurality of the BAW resonators, wherein the first Mo, W, Al, Pt, or Au layer or the second Mo, W, Al, Pt, or Au layer operatively couples one or more BAW resonators of the plurality of the BAW resonators to form a BAW filter.

* * * * *